United States Patent [19]

Boatwright et al.

[11] Patent Number: 4,749,907

[45] Date of Patent: Jun. 7, 1988

[54] METHOD AND APPARATUS FOR AUTOMATICALLY CALIBRATING A GRATICULED CATHODE RAY TUBE

[75] Inventors: John P. Boatwright; Alan M. Feuerbacher, both of Aloha; Timothy M. Holte, Beaverton, all of Oreg.

[73] Assignee: Tektronix, Inc., Beaverton, Oreg.

[21] Appl. No.: 803,693

[22] Filed: Dec. 2, 1985

[51] Int. Cl.[4] .................. H01J 31/26; H04N 17/02; G01R 13/20

[52] U.S. Cl. .......................... 315/10; 358/10; 358/69; 324/74; 324/121 R; 324/130

[58] Field of Search .................. 315/10; 358/10, 69; 324/74, 121 R, 130

[56] References Cited

U.S. PATENT DOCUMENTS

| | | | |
|---|---|---|---|
| 3,501,583 | 3/1970 | Schwartz | 358/69 |
| 3,872,348 | 3/1975 | Astley | 358/69 |
| 4,099,092 | 7/1978 | Bristow | 315/10 |
| 4,160,935 | 7/1979 | Groot et al. | 315/10 |
| 4,231,060 | 10/1980 | Culter | 315/10 |
| 4,441,120 | 4/1984 | Gerritser | 358/10 |
| 4,471,270 | 9/1984 | Guyot | 315/10 |
| 4,553,091 | 11/1985 | Bristol | 324/130 |
| 4,602,272 | 7/1986 | Duschl | 315/10 |
| 4,607,288 | 8/1986 | Freyberger | 315/10 |
| 4,677,340 | 6/1987 | Miller et al. | 315/10 |

FOREIGN PATENT DOCUMENTS

0194486  11/1983  Japan ..................... 358/69

*Primary Examiner*—Theodore M. Blum
*Assistant Examiner*—David Cain
*Attorney, Agent, or Firm*—Mark L. Becker

[57] ABSTRACT

A method and apparatus for automatically calibrating the deflection of an electron beam in a graticuled cathode ray tube. The apparatus includes a microprocessor and digital-to-analog converter for generating input signals of a predetermined accuracy and sending the signals to an amplifier of a cathode ray tube to deflect the electron beam across graticule lines on the faceplate. A phototransistor optically coupled to the faceplate detects the electron beam coinciding with the graticule and in response generates an electrical signal. Signal processing circuitry processes the signal to remove noise from it and retrieve detection signals. The microprocessor receives the detection signals from the signal processing circuitry, compares each detection signal to its corresponding input signal, and adjusts the gain and offset of the amplifier in response to the comparison. Additional circuitry digitally records the beam position relative to the graticule lines.

4 Claims, 8 Drawing Sheets

METHOD AND APPARATUS FOR AUTOMATICALLY CALIBRATING A GRATICULED CATHODE RAY TUBE

REFERENCE TO RELATED APPLICATION

This application is filed simultaneously with copending application Ser. No. 803,685, filed Dec. 2, 1985.

TECHNICAL FIELD

This invention relates to a method and apparatus for calibrating a cathode ray tube and, more particularly, to a method and apparatus for automatically calibrating the deflection of an electron beam in a graticuled cathode ray tube.

BACKGROUND OF THE INVENTION

Cathode ray tubes (CRTs) used in many electrical measurement instruments have a graticule imprinted on their faceplates for measuring the waveform produced by the beam in response to an electrical signal. The deflection of the electron beam must be periodically calibrated to the graticule to ensure the deflection is accurate. Until the present invention, this calibration has largely been done manually. A highly accurate input signal is applied to the amplifying means driving the CRT to deflect the electron beam to a graticule line that correctly measures the value of the input signal. A human operator then visually determines the position of the beam relative to the graticule line and manually adjusts the amplifying means until the beam coincides with the line.

This manual approach is expensive because it is slow and labor intensive. It is also relatively inaccurate. The electron beam is wider than the graticule lines, making it difficult to visually align the center of the beam with the center of the graticule line.

Despite these drawbacks, this approach has remained the prevalent method of calibration, although techniques for locating the position of the beam automatically have been known for some time. For example, beam indexing cathode ray tubes employed for color television applications can accurately locate the tube's electron beam so as to register properly with the separate color-emitting phosphors of the primary colors. U.S. Pat. Nos. 4,257,869; 2,778,971; and 2,790,107, and British Pat. No. 822,017 illustrate cathode ray tubes that employ indexing elements, strips, or bands supplying feedback indicative of an electron beam's actual position. The indexing elements produce a light emission or electron emission when crossed by an electron beam and this emission is detected within the tube in order to energize the beam at the correct time. Such tubes, however, require sophisticated and complex screen techniques to manufacture and therefore are expensive to produce.

Other methods that have been tried include employing an electronic graticule or a television camera to record the beam striking the CRT faceplate. These methods, too, are relatively slow and expensive.

SUMMARY OF THE INVENTION

Therefore, an object of the present invention is to provide a method and apparatus for automatically calibrating the deflection of an electron beam in a graticuled CRT device.

Another object of the invention is to detect optically the coincidence of the beam with a graticule line of the CRT.

Another object of the invention is to adjust automatically the deflection of the electron beam in response to the detection of the beam's coincidence with the graticule line.

Another object of the invention is to record electronically the beam screen position relative to the graticule line to enable the beam deflection to be correctly adjusted.

Another object of the invention is to improve the detectability of the coincidence of the electron beam with a graticule line in the presence of ambient electrical and optical noise.

To achieve these objects, an automatic calibrating apparatus is disclosed. A microprocessor-based signal generating means is coupled to amplifiers of the graticuled CRT for generating a plurality of predetermined input signals that deflect the electron beam across several graticule lines on the CRT faceplate. A detecting means for detecting the coincidence of the deflected electron beam with a graticule line generates a detection signal in response to such detection. Means are provided for comparing each detection signal to its corresponding input signal. Means that act in response to this comparison are further provided for adjusting the amplifiers associated with the CRT to cause the electron beam to coincide with a graticule line that correctly represents the input signal.

In a preferred embodiment, the detecting means comprises a phototransistor optically coupled to the faceplate for detecting the light intensity generated by the electron beam coinciding with a graticule line and transforming the detected light into an electrical signal. The signal generating means comprises a microprocessor controlling a digital-to-analog voltage converter. The comparing means are present within the microprocessor which determines from the input signal-detection signal comparison how the amplifying means must be adjusted to calibrate the beam deflection. The microprocessor also adjusts the amplifiers.

The automatic calibrating apparatus may further include beam position recording circuitry for generating measurement signals that digitally record the position of the beam relative to the graticule lines. The amplifiers are then adjusted in response to the measurement signals to calibrate the deflection of the beam to the graticule lines.

To improve the detectability of the beam coinciding with a graticule line, means for modulating the electron beam and signal processing means for demodulating the electrical signal produced by the phototransistor are incorporated into the invention. In one embodiment thereof, the modulating means deflects the beam between alternating positions on the faceplate of the display device, the alternating positions moving across the faceplate and spaced a distance apart to prevent the beam from consecutively striking a graticule line as the beam is swept across the graticule. The signal processing means synchronously samples the detection signal from the detecting means in each alternate beam position and subtracts the signal detected at one position from that detected at the alternate position. This subtraction removes the portion of the signal due to ambient light intensity. The remaining signal, if any, is due to light intensity from the beam coinciding with a graticule line.

In a second embodiment, the modulating means alternately energizes and blanks the electron beam at a predetermined frequency. The signal processing means is tuned to that frequency to filter out detection signals due to ambient light.

A method for calibrating the beam is also disclosed. The steps include generating a plurality of input signals of a predetermined accuracy to deflect the beam across a graticule line on the faceplate of the CRT; detecting the beam coinciding with a graticule line and generating in response a detection signal; comparing a detection signal to its corresponding input signal; adjusting the amplifying means in response to the comparison; and iteratively repeating the previous steps until a predetermined input signal deflects the beam to coincide with a graticule line that correctly represents the input signal.

To accelerate the method, it may further include the steps of generating a plurality of input signals corresponding to known beam positions on graticule lines; generating measurement signals corresponding to these positions to record digitally the beam screen position; adjusting the amplifying means in response to the measurement signals; and iteratively repeating the previous steps until the beam coincides with the graticule line that correctly represents the input signal.

The foregoing and other objects, features, and advantages of the invention will become more apparent from the following detailed description of preferred embodiments which proceeds with reference to the accompanying drawings.

DETAILED DESCRIPTION

Automatic Calibrating Apparatus

Figure 1:
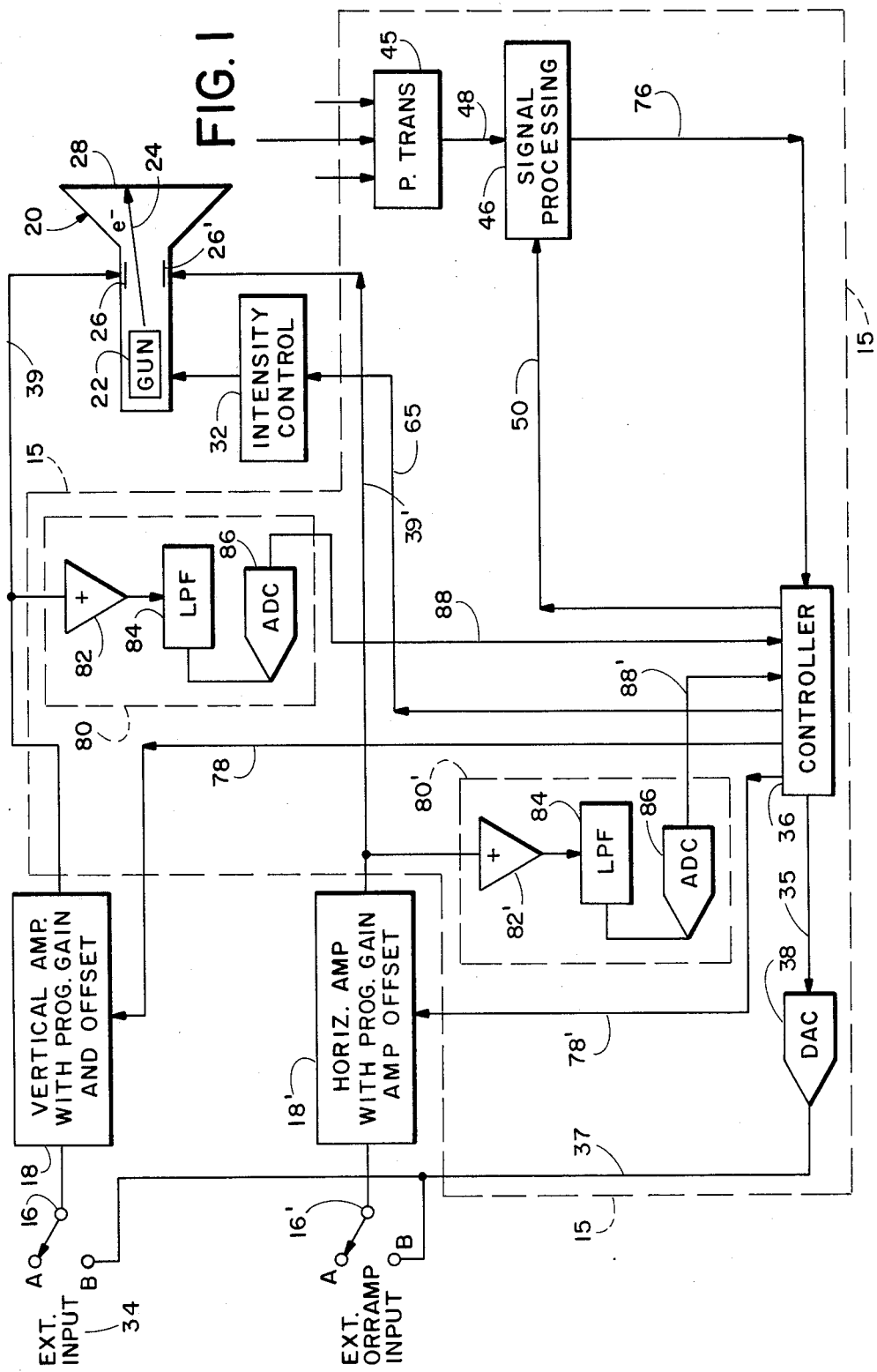
FIG. 1 is a schematic diagram of a circuit for an automatic calibrating apparatus according to the invention.

An automatic calibrating circuit 15 according to the invention is shown outlined in FIG. 1. It is switchably connected at switches 16, 16' to vertical and horizontal variable gain amplifiers 18, 18' that drive a cathode ray tube (CRT) 20. The CRT 20 includes an electron gun 22 that generates an electron beam 24, and beam deflection plates 26, 26' that connect to amplifiers 18, 18', respectively. The CRT 20 also includes a faceplate 28, shown in front view in FIG. 3, with a graticule 30 on its inner side facing the electron gun 22. The gun 22 is controlled by an intensity control 32. The graticule 30 provides a scale for measuring the amplitude and frequency of an electrical waveform produced by the beam 24 striking the faceplate 28. This waveform is controlled by the gain and offset of amplifiers 18, 18' which deflect the electron beam 24 vertically and horizontally across the graticule 30. The calibrating circuit 15 calibrates the deflection of the beam 24 to the graticule 30 by automatically adjusting the gain and offset of the amplifiers 18, 18' through an iterative process discussed in detail herein. Once the beam deflection is calibrated, the CRT 20 and amplifiers 18, 18' can be switchably connected at switches 16, 16' to external inputs 34 to accurately produce a waveform of the external signal.

With automatic calibration selected by activating switches 16, 16', the process is initiated by signal generating means such as a software routine within controller block 36 of FIG. 1 comprising an 80186 microprocessor manufactured by Intel Corporation and its associated peripheral circuitry. The software routine generates a plurality of predetermined digital signals corresponding to input signal voltages for the amplifiers 18, 18'. These digital signals are generated in a unique search pattern and are directed along a signal path 35 from the controller block 36 to a digital-to-analog voltage converter (DAC) 38 to be converted to accurate analog input voltages. These voltages are sent or transmitted along a signal path 37 to the variable amplifiers 18, 18' through switches 16, 16'. At amplifiers 18, 18', they are amplified according to the gain and offset of the amplifiers and sent along signal paths 39, 39' to plates 26, 26' to deflect the beam 24 across a portion of the faceplate 28 and its graticule 30. The amplifiers 18, 18' are programmable or otherwise variable to permit adjustment of their gain and offset for calibration.

In calibrating the CRT, only one programmable amplifier is variable at a time, with the other fixed at a constant value so that the beam is calibrated first in one direction, such as horizontally, and then in the other direction, vertically. The description will proceed with the reference to the vertical amplifier 18 but is equally applicable to calibration of amplifier 18'. Portions of circuit 15 that are duplicated for amplifier 18' are indicated by primed numerals.

Figure 2:
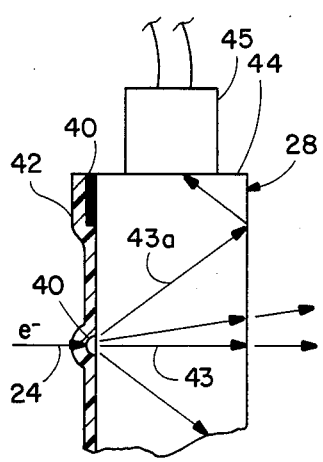
FIG. 2 is a cross sectional view of a beam striking a faceplate of a cathode ray tube.
Figure 3:
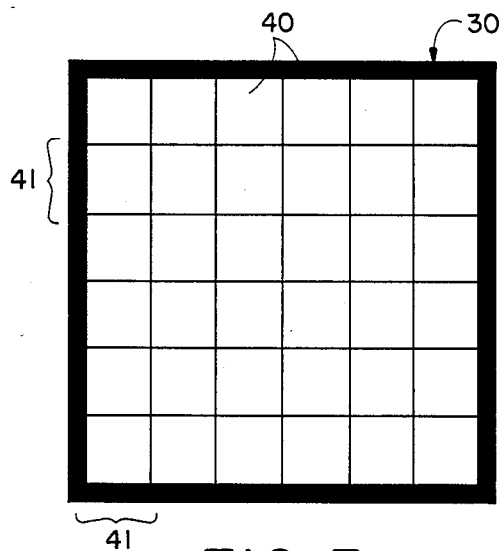
FIG. 3 is a front view of a graticuled faceplate.

The cross-sectional view of the faceplate 28 is shown in FIG. 2, with a front view shown in FIG. 3. Referring to the two figures, the faceplate is composed of a glass with the graticule 30 provided on the inner surface thereof by printing lines 40 of glass frit thereon. The lines 40 divide the graticule into divisions 41. The glass frit can be of numerous colors, such as orange or white, over which phosphor 42 is applied.

Upon generation, the electron beam 24 strikes the phosphor 42 and generates light 43 which indicates the beam's location. When the beam 24 coincides with a graticule line 40, a portion of light 43a is optically coupled by the graticule material into the faceplate 28. As shown in FIG. 2, this portion of light 43a is reflected internally toward a lateral edge 44. Here, the light 43a is detected by a photoelectric means such as a phototransistor 45 that transforms the light intensity into a representative electrical signal.

Figure 4:
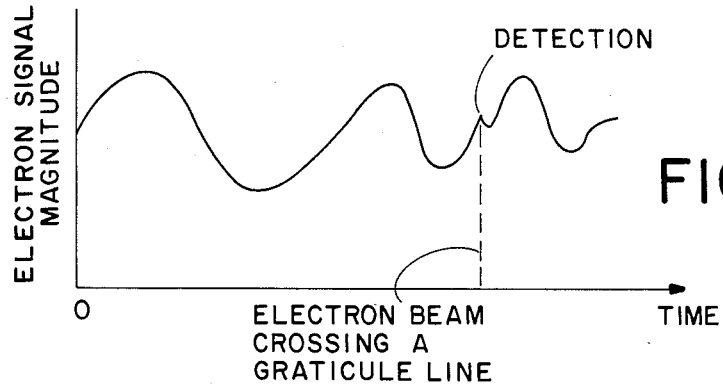
FIG. 4 is a graph of the electrical signal produced by the phototransistor from the detected light intensity within the faceplate.
Figure 5:
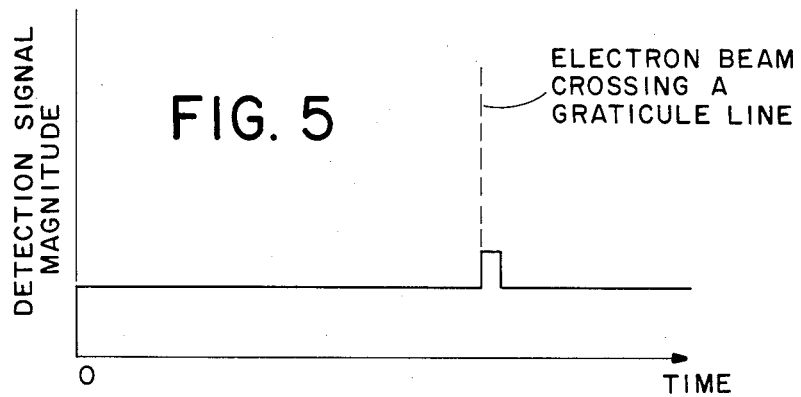
FIG. 5 is a graph of the detection signal produced by signal processing of the electrical signal of FIG. 4.

The light intensity picked up by the phototransistor 45, however, includes light intensity from ambient light in addition to light intensity from light 43a. Referring to FIG. 4, a typical electrical signal generated by the phototransistor in response to total light intensity detected is shown. Relative to the signal resulting from ambient light and other optical and electrical noise picked up by the phototransistor, the electrical detection signal is quite small. To retrieve the electrical signal indicating detection and produce a distinct detection signal, the circuit includes beam modulating means and signal processing means for demodulating the electrical signal. The desired result of this modulation and demodulation is shown in FIG. 5, with the detection signal now a sharp digital pulse.

Figure 6:
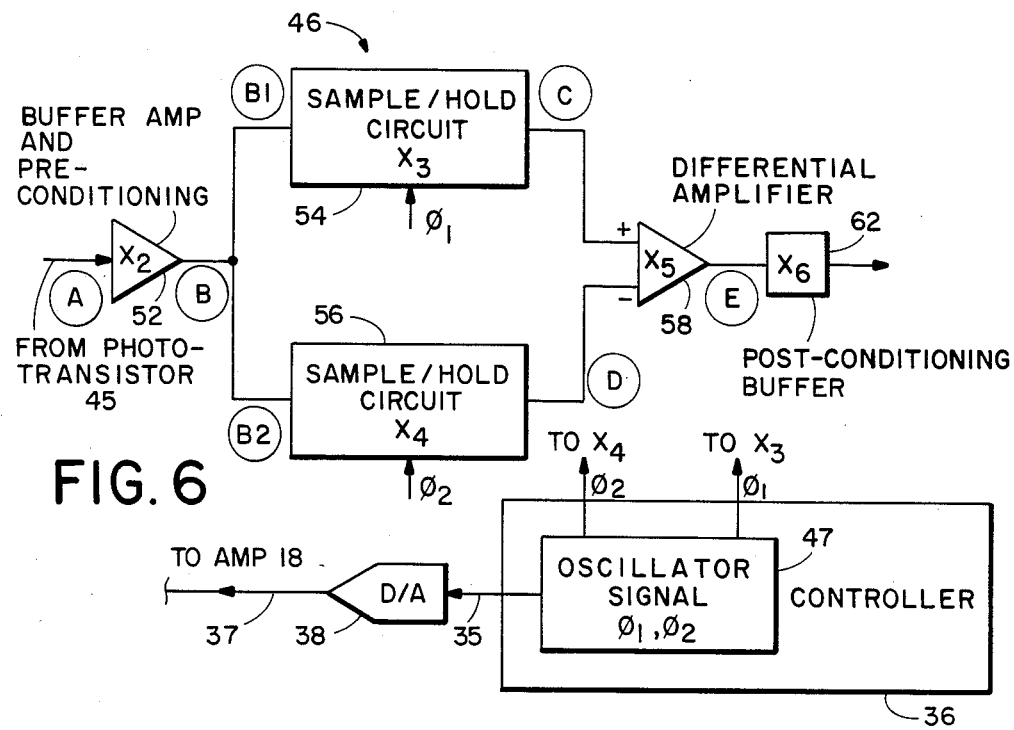
FIG. 6 is a diagram of a first embodiment of a means for modulating the electron beam and signal processing the electrical signal of FIG. 4.
Figure 6A:
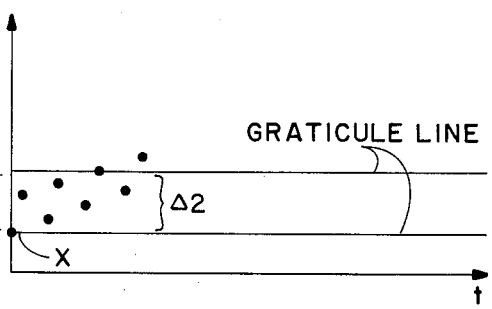
FIG. 6A is a graph of the beam modulation employed in the first embodiment.
Figure 7:
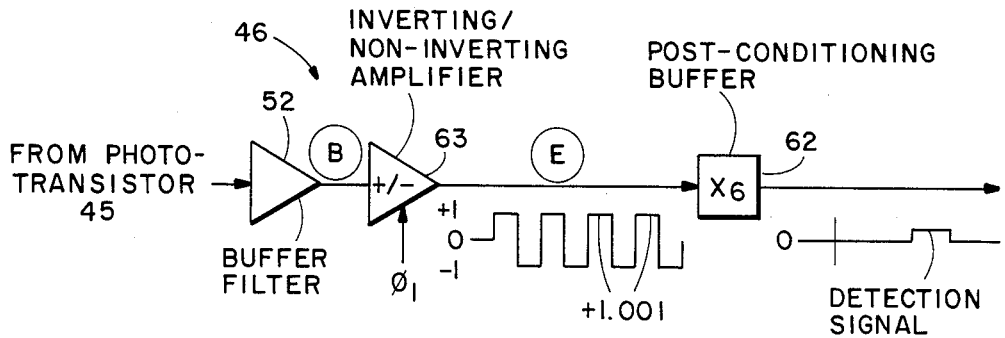
FIG. 7 is a schematic diagram of a variation of the signal processing circuit in FIG. 5.
Figure 8:
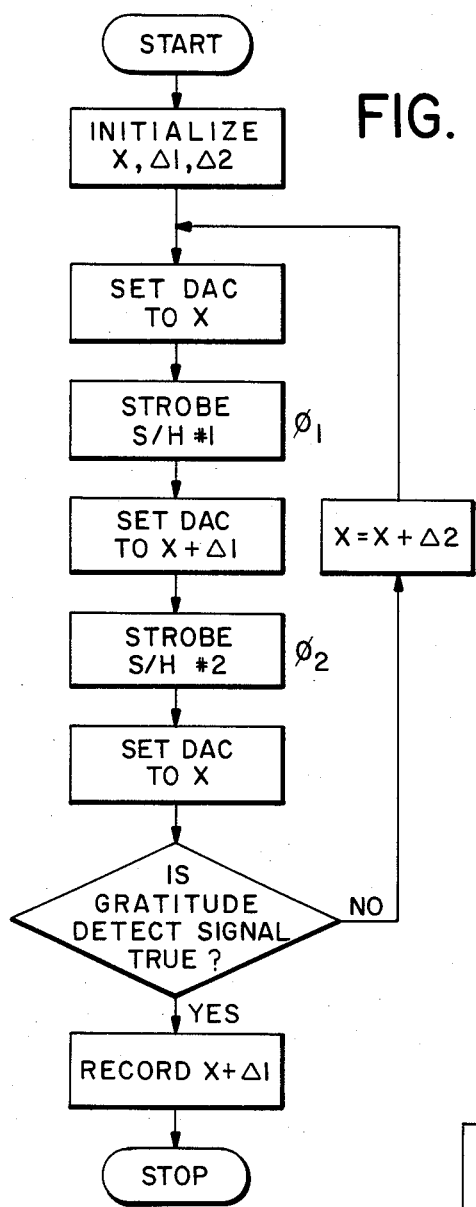
FIG. 8 is a flowchart illustrating the method of modulating the electron beam illustrated in FIG. 6.

Two embodiments for modulation and signal processing are disclosed, the first of which is illustrated in FIGS. 6 and 7. Referring to FIG. 6, a beam modulating means such as an oscillating signal 47 is incorporated into the circuit 15. The oscillating signal 47 in this embodiment is produced by software routines within the controller 36. The oscillating signal causes the amplifier 18 to deflect the beam 24 between alternating, moving positions illustrated in FIG. 6A so that no two beam positions can be located consecutively in time on graticule lines 40. X represents the initial signal value, with an additional signal value Δ1 equal to about a 0.2 graticule division deflection and an additional signal value Δ2 equal to about 0.01 graticule division deflection. The oscillating signal 47 has two phases, $\phi1$ and $\phi2$, 180° out of phase. During $\phi1$, no additional signal is present. During $\phi2$, the additional signal value Δ1 is added to the original input signal generated by the controller block 36. If no coincidence occurs during either phase, the base signal value X is incremetally changed to X+Δ2 and the process is performed again, as shown in FIG. 8 and described hereafter.

The electrical signal produced by the phototransistor 45 in response to the modulated beam is sent to signal processing means within signal processing block 46 along signal path 48. The signal processing means demodulates the signal to produce the detection signal, receiving oscillating signal 47 through a signal path 50. Within the processing means a band-pass filter/buffer 52 tuned to the oscillator frequency filters and buffers the electrical signal A generated by the phototransistor 45 and produces an output voltage B corresponding to the light intensity detected. When $\phi1$ is true, voltage signal B1 is sampled by sample-and-hold circuit 54. When $\phi2$ is true, signal B1 is held by circuit 54 while a second sample-and-hold circuit 56 acquires the new voltage signal B2. The two output voltages C, D of sample-and-hold circuits 54, 56 are sent to the inputs of a differential amplifier 58 which subtracts one voltage from another voltage to remove that portion of the voltage due to ambient light and other noise. The output voltage E, if any, corresponds to the light intensity from the beam striking the phosphor 42 adjacent to the graticule line 40. Voltage E is then routed through a post-conditioning buffer/low-pass filter 62 which reduces the amplitude of nonsynchronous aliased noise and sends the demodulated signal as the detection signal.

For example, assume that while $\phi1$ is true, the beam 24 coincides with the graticule line 40 as shown in FIG. 6A. The beam deflection is caused at this point by the input signal X. The voltage C at the output of sample-and-hold 54 equals:

$$\text{Voltage at C} = \text{ambient light noise} + \text{signal due to graticule line.} \quad (1)$$

When $\phi2$ is true, the beam deflection is caused by the base input signal plus the incremental signal value $\phi1$. In this example, the beam 24 cannot strike a graticule line 40, and the output voltage D at the output of sample-and-hold circuit 56 is less:

$$\text{Voltage at D} = \text{ambient light noise.} \quad (2)$$

The subtraction performed by the differential amplifier 58 leaves only the voltage due to the beam striking the graticule line:

$$\text{Voltage at E} = \text{signal due to graticule.} \quad (3)$$

A variation of this embodiment is shown in FIG. 7. The sample-and-hold circuits 54, 56 and the differential amplifier are replaced by an inverting/noninverting amplifier 63. The output voltage B from the buffer/filter 52 is the input to amplifier 63, with the gain sense of the amplifier (inverting or noninverting) keyed to the oscillating signal $\phi1$. The output voltage E of the amplifier 63 is then a square wave as shown in FIG. 7, symmetrical so long as the beam does not coincide with the graticule and asymmetrical when coincidence occurs. The average value of voltage E is other than zero when the beam coincides with the graticule line. This occurs in the example and averaging is performed by post-conditioning buffer/filter 62 to output a detection signal as shown in FIG. 7.

A flowchart of the method employed by this position modulating embodiment is shown in FIG. 8. The initial signal value X generated by DAC 38 provides deflection to the area of a specific graticule line, for example, the third horizontal line. The sample-and-hold circuit 54 is then strobed while $\phi1$ is true, and the signal generated by DAC 38 is incremented by Δ1 to deflect the beam an additional $\phi1$ distance. Sample-and-hold circuit 56 is then strobed while $\phi2$ is true. DAC 38 is reset to the initial signal value X, and the two sample-and-hold circuits 54, 56 are compared to see if one voltage exceeds the other. If they are equal, no coincidence occurred. The initial signal value X is incremented to a new value X equal to the signal value X plus Δ2. The loop is repeated until a coincidence produces a detection signal that is then recorded by controller block 36.

Figure 9:
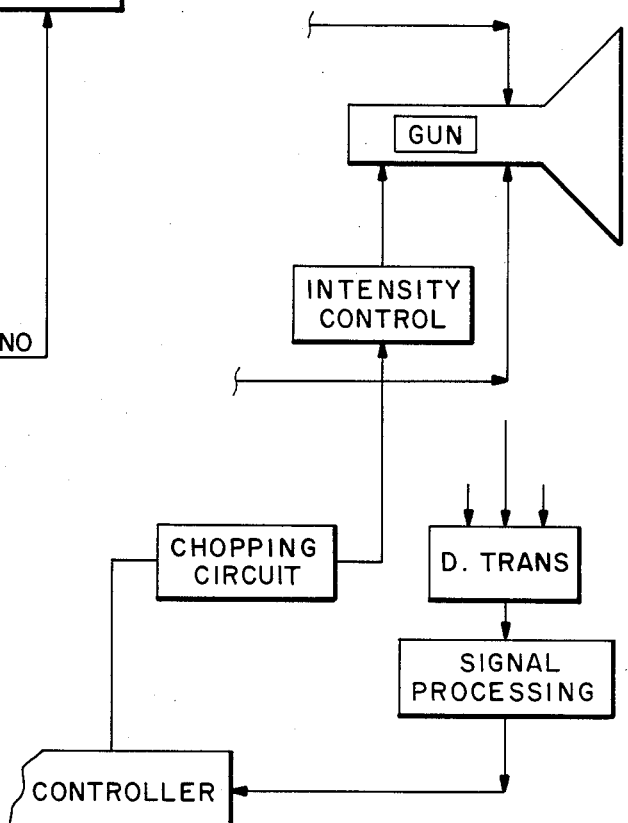
FIG. 9 is a diagram of a second embodiment of a means for modulating the electron beam and signal processing the electrical signal of FIG. 4.

A second embodiment of the modulating means, one that employs intensity modulation, and signal processing means are shown in FIG. 9. Modulation of the electron beam 24 is performed by a chopping circuit 64 inserted along signal path 65 between the controller 36 and the intensity control 32. The chopping circuit 64 energizes and blanks the electron beam 24 at a predetermined frequency, typically between 1 kHz and 50 kHz. The chopping signal produces a square wave along the Z (intensity) axis of the CRT 20 while the beam is swept across the graticule 30 by input signals from controller block 36.

Figure 10:
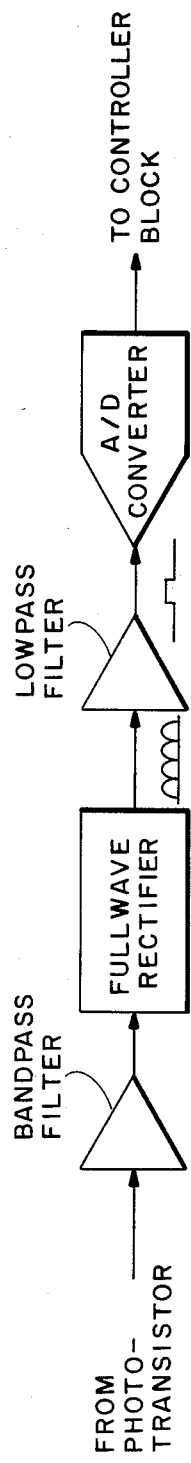
FIG. 10 is a schematic diagram of a signal processing circuit of FIG. 9.
Figure 11:
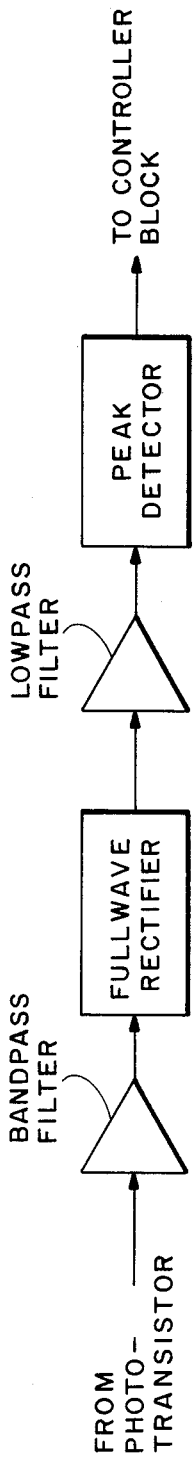
FIG. 11 is a schematic diagram of a variation of the signal processing circuit in FIG. 10.

Signal processing means for demodulating the electrical signal produced by phototransistor 45 are shown in FIG. 10. The signal processing means include a bandpass filter 66 coupled to the output of phototransistor 45 and tuned to the chopping frequency of circuit 64. The output of the filter 66 is the input to a full wave rectifier 68 whose output 69 is shown next to the rectifier. The output 69 is the input to a low-pass filter 70 which averages the signal value as output signal 71. When the beam 24 coincides with a graticule line 40, the increase in the resulting electrical signal is detected by the full-wave rectifier 68 and filtered by the low-pass filter 70. The signal 71 is then transmitted to an analog-to-digital converter 72 which generates the detection signal. The circuit of FIG. 11 is similar to that of FIG. 10, except that the analog-to-digital converter 72 is replaced by a peak detector 74.

Figure 12:
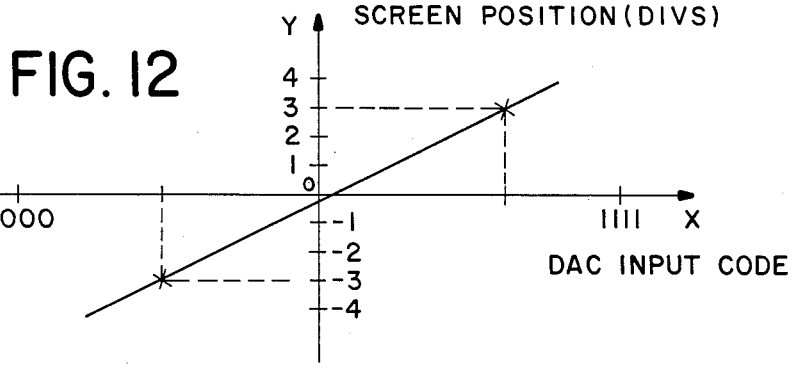
FIG. 12 is a graph of beam position measurement signals relative to the predetermined input signals.

After the electron beam 24 is modulated and the electrical signals demodulated in either of the first or second embodiments above, the detection signals are fed along a signal path 76 to controller block 36. Signal comparing means such as software routines within the microprocessor of block 36 compare each detection signal to its corresponding input signal. This comparison is illustrated in the graph of FIG. 12, where the reference along the x axis is the DAC input code generated by the controller block 36 and the reference along the y axis is the beam position scaled by graticule lines. By plotting the two points and assuming a linear relationship, a line may be drawn relating beam position to voltage. The equation of the line takes the following form:

$$y = mx + b \tag{4}$$

where m is the gain from the input voltage signal produced by DAC 38 through the amplifier 18 to the deflection of the beam 24 and b is the effective input offset voltage for signal path 39.

Given the data recorded by the comparing means and represented by FIG. 12, the gain and offset of amplifier 18 are adjusted by the microprocessor within controller block 36 through signals sent along a connecting signal path 78. This adjustment process is iterative and is continued until the beam 24 strikes a graticule line that correctly represents the input signal.

An example illustrates the process. A beam deflection of six divisions (one graticule line per division) is desired when the voltage at the input to amplifier 18 is changed by 6 volts (v). Also, when the input to amplifier 18 is at $-3$ v, it is desired that the beam be deflected to the third graticule line below the center graticule line and when the input is at $+3$ v, the beam be deflected to the third graticule line above the center graticule line.

With switch 16 set to position B in FIG. 1, suppose that a voltage of 2.8 v from DAC 38 resulted in a detection signal at the output of the signal processing block 46. The detection signal indicates that the electron beam 24 has crossed the +third graticule line. When DAC 38 generates a voltage of $-3.1$ v, another detection signal is produced, indicating that the electron beam has crossed the $-$third graticule line. If the amplifier 18 had been adjusted as desired, the voltages required by the DAC 38 would have been $+3.0$ v and $-3.0$ v for the two previously mentioned measurements, or 6 v for six divisions. The actual gain compared to the desired gain can be quantified with the following equation:

$$\frac{(+2.8) - (-3.1)}{(+3.0) - (-3.0)} = 0.98 \tag{5}$$

This ratio would be 1.0 if the desired gain had been realized; so the gain in this example needs to be increased. The gain may be adjusted incrementally upward and the measurements repeated until the desired gain is achieved.

To check the offset, the voltages determined previously are averaged:

$$\frac{(+2.8) + (-3.1)}{2} = -0.15 \tag{6}$$

The result is then tested for greater or less than zero. If greater than zero, the offset of the amplifier is adjusted incrementally downward. If less than zero, as in this example, the offset is adjusted incrementally upward. The entire process is then repeated until the desired offset (zero in this case) is achieved. Adjusting the gain changes the slope of the line in FIG. 12 while adjusting the offset changes the y intercept. If an offset of zero is desired, the line should pass directly through the intersection of the two axes.

The foregoing circuit and method described will work adequately but are relatively slow in some situations because of the low signal to noise ratio that results from using photodetection to locate graticule lines after each adjustment. To accelerate the process, beam position recording circuitry 80 is provided to digitally record the position of the electron beam relative to the graticule line 40. As shown in FIG. 1, the circuit 80 branches from signal path 39 to route signals from amplifier 18 through circuit 80 to controller block 36. This circuitry comprises an amplifier 82 coupled to the output of amplifier 18, a low-pass filter 84 and an analog-to-digital converter (ADC) 86 coupled to the controller block 36 along a signal path 88. The low-pass filter 84 reduces the noise at the input to the ADC 86. Circuitry 80 can then "pick off" voltages at the output of amplifier 18 and convert them to binary numbers at the output of ADC 86 for recording by the controller block 36. The repeated detecting by the phototransistor 45 of the beam crossing graticule lines 40 is unnecessary because the position of the beam 24 relative to the lines 40 of graticule 30 can be digitally represented by the ADC 86 binary output code.

Figure 13:
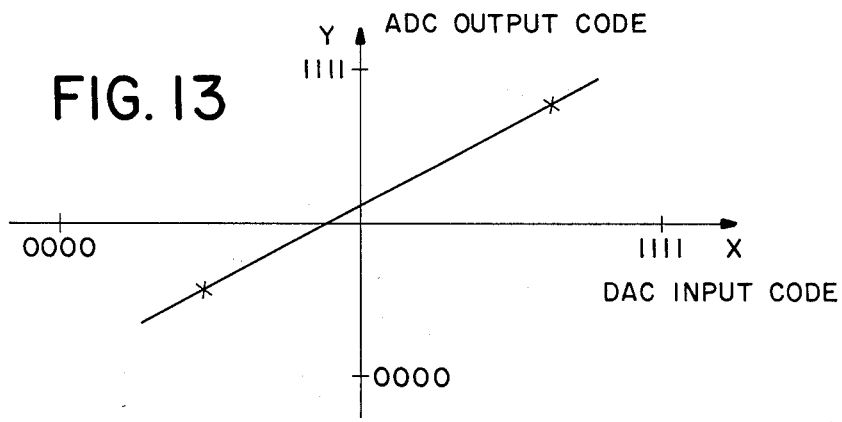
FIG. 13 is a graph of beam position measurement signals relative to the predetermined input signals.

The operation of circuit 80 is best understood by example. Referring to the graph of FIG. 12, the linear relationship between DAC binary input code from controller block 36 and the beam position on the screen is shown. This relationship is obtained by an initial run through the calibration process described above, with the beam-graticule coincidence optically detected. Controller block 36 then generates on a second run the DAC binary input codes corresponding to two graticule lines (e.g., the $+3$ line and the $-3$ line), and the resulting ADC binary output code of circuitry 80 is recorded within controller block 36. This relationship between DAC binary input codes and ADC binary output codes is shown in the graph of FIG. 13. The graphs of FIGS. 12 and 13 have a common parameter, the DAC binary input code. By substituting the corresponding ADC binary output code in FIG. 13 for the DAC binary input code in FIG. 12, the graph of FIG.

14 can be constructed, which relates beam position on the graticule to ADC binary output code. This relationship is independent of the gain of amplifier 18 and illustrates beam position digitally.

Figure 14:
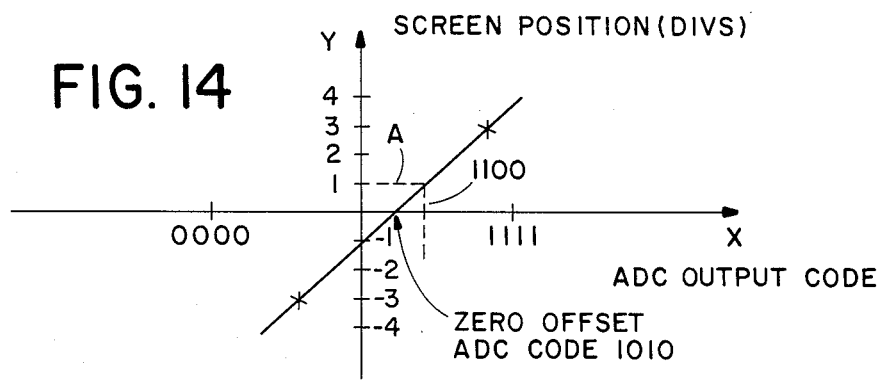
FIG. 14 is a graph of beam screen position on a graticule relative to beam position measurement signals.

With the linear relationship of FIG. 14 established, the beam deflection is now adjusted with reference to the ADC binary output code of circuit 80 that signals the position of the beam 24. For example, suppose a sensitivity of 10 mv/div and an offset of zero volts is desired for the electron beam 24. Controller block 36 outputs an additional input signal corresponding to zero volts to test for offset. Referring to FIG. 14, the dotted line shows the beam position A that results as "picked off" by circuitry 80 and coded by ADC 86. The ADC binary output code 1100 is greater than the ADC binary code 1010 determined by interpolation to be equal to a zero offset. The offset is thus too high and the amplifier offset is adjusted incrementally downward. A new measurement is then made. The process is repeated, adjusting the offset incrementally upward or downward according to equation (6), until the desired offset is achieved. To set the gain of amplifier 18, the controller block 36 outputs voltages of a predetermined accuracy that should correspond to a pair of graticule lines such as +30 mv and −30 mv. Measurements are recorded from the ADC binary output code at each beam position, as shown in FIG. 14. The difference between the ADC binary output codes and the desired value is then calculated according to equation (5), and the gain is adjusted accordingly. The process is iteratively repeated until the desired gain is achieved.

In the example above, the gain and offset of variable amplifier 18 are mutually independent, and adjustment of one does not affect the other. Some amplifier implementations, however, have interaction between gain and offset adjustments. With such amplifiers, offset and gain adjustments may have to be repeated with further iteration using a known convergence algorithm until the desired calibration is reached.

The Method

Figure 15:
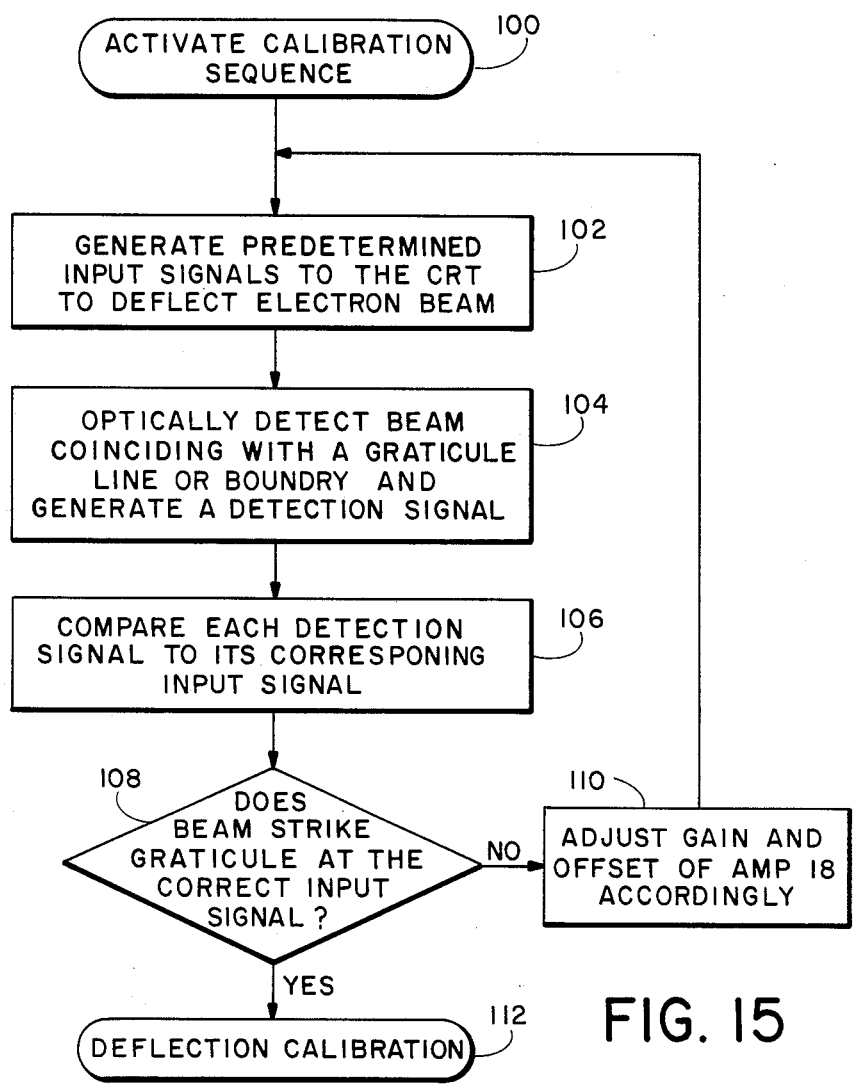
FIG. 15 is a flow chart of the method of the invention.

The calibrating method of the invention is inherent in the embodiment disclosed herein but is not limited to that apparatus. Referring to FIG. 15, a flowchart depicting the primary steps of the method is shown. Once calibration is selected (block 100), a sequence of "bench mark" signals is generated (block 102) to deflect the electron beam across the lines 40 of graticule 30 in a unique search pattern set by controller block 36. When the beam strikes a graticule line 40, this coincidence is optically detected (block 104) and compared to the corresponding input signal (block 106). The comparison is tested (block 108), and the gain and offset of the amplifier are adjusted iteratively (block 110) until the desired accuracy of calibration is achieved (block 112).

Figure 16:
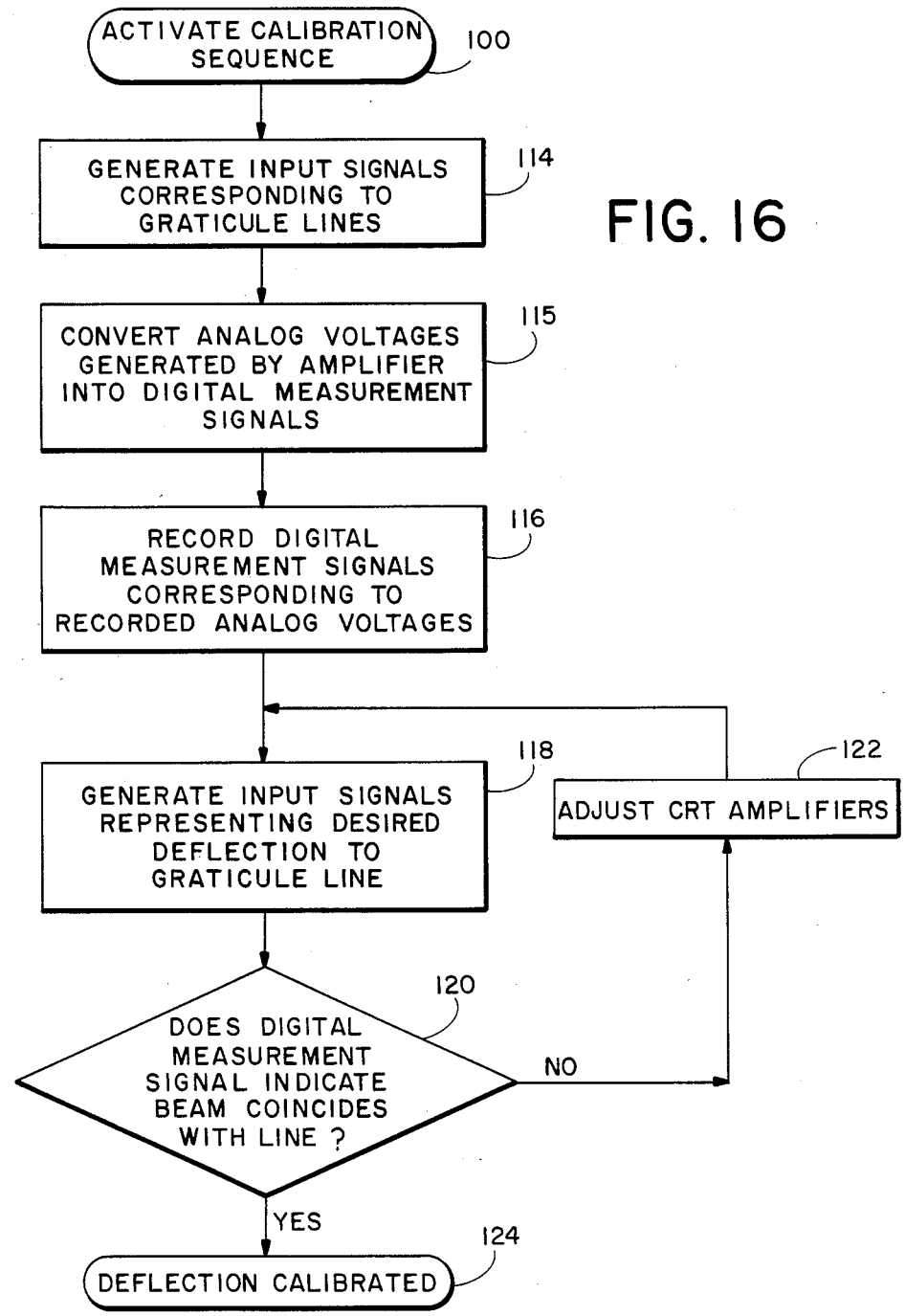
FIG. 16 is a flow chart of additional steps to the method of FIG. 11.

As shown in FIG. 16 and discussed above, this basic method may be accelerated to improve its operation. Input signals corresponding to known beam positions on graticule lines are generated by the controller block 36 (block 114). The resulting analog voltages produced by amplifier 18 are connected to digital measurement signals (block 115) and recorded within controller 36 (block 116). Additional input signals that represent the desired deflection are then sent or transmitted by the controller block 36 (block 118). The input signals are compared to the resulting digital measurement signals to check for desired deflection (block 120). If deflection is not correct, the amplifier 18 is adjusted (block 122) and the additional input signals are retransmitted until the beam deflection is calibrated to the graticule 30 (block 124).

Having illustrated and described the principles of the invention in preferred embodiments, it should be apparent to those skilled in the art that the invention can be modified in arrangement and detail without departing from such principles. We claim all modifications coming within the spirit and scope of the following claims.

We claim:

1. An apparatus for automatically calibrating the deflection of an electron beam in a cathode ray tube including a graticuled faceplate, comprising:
   a graticule having a pattern of lines mounted on the faceplate for optically coupling light into the faceplate, the coupled light reflected internally within the faceplate toward its edges;
   amplifying means coupled to the cathode ray tube for deflecting the electron beam;
   signal generating means coupled to the amplifying means for generating a plurality of input signals of a predetermined accuracy to deflect the electron beam across a graticule line of the faceplate;
   photoelectric means mounted adjacent to an edge of the faceplate for detecting the internally reflected light and generating in response a detection signal;
   signal comparing means coupled to the signal generating means and the photoelectric means for comparing the detection signal to its corresponding input signal;
   adjustment means in communication with the signal comparing means and amplifying means for adjusting the amplifying means to cause the electron beam to coincide with a graticule line that correctly represents the input signal causing the deflection; and
   modulating means for modulating the electron beam and signal processing means for demodulating detection signals produced by the photoelectric means to improve the detectability of electron beam coincidence with the graticule line in the presence of electrical and optical noise.

2. The calibrating apparatus of claim 1 in which the modulating means comprises oscillating means generating a signal for deflecting the beam between alternating, moving positions on the faceplate of the display device, the alternating positions spaced a distance apart to prevent the beam from consecutively striking a graticule line.

3. The calibrating apparatus of claim 1 in which the modulating means comprises beam chopping means for alternately energizing and blanking the electron beam at a predetermined frequency.

4. An apparatus for automatically calibrating the deflection of an electron beam in a cathode ray tube including a faceplate having a layer of phosphor material thereon, comprising:
   amplifying means associated with the cathode ray tube for deflecting the electron beam;
   a graticule having lines mounted on the faceplate for optically coupling into the faceplate light generated by the electron beam striking the phosphor over a graticule line, the light reflected internally within the faceplate toward its edges;
   control means for generating a plurality of input signals;
   analog voltage generating means coupled to the control means to receive input signals therefrom for converting the signals to analog voltages of a predetermined accuracy to deflect the electron beam across a graticule line of the faceplate;

modulating means for modulating the electron beam;

photoelectric means mounted adjacent to an edge of the faceplate for detecting the light coupled into the faceplate and internally reflected therein, the photoelectric means generating in response to each beam coincidence with a graticule line a detection signal;

signal processing means for demodulating the electrical signals to retrieve the detection signals;

signal comparing means for comparing the detection signals with the input signals; and adjustment means for adjusting the amplifying means in response to the comparison of the input signals with the detection signals to cause the electron beam to coincide with a graticule line that correctly represents the input signal causing the deflection.

* * * * *